United States Patent
Rozbicki et al.

(10) Patent No.: US 6,607,977 B1
(45) Date of Patent: Aug. 19, 2003

(54) METHOD OF DEPOSITING A DIFFUSION BARRIER FOR COPPER INTERCONNECT APPLICATIONS

(75) Inventors: Robert Rozbicki, San Jose, CA (US); Michal Danek, Cupertino, CA (US); Erich Klawuhn, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/965,472

(22) Filed: Sep. 26, 2001

Related U.S. Application Data
(60) Provisional application No. 60/275,803, filed on Mar. 13, 2001.

(51) Int. Cl.[7] .......................................... H01L 21/4763
(52) U.S. Cl. ...................... 438/627; 438/597; 438/622; 438/625; 438/672; 438/687; 438/643; 438/653
(58) Field of Search ................................. 438/597, 622, 438/625, 627, 672, 687, 643, 653

(56) References Cited

U.S. PATENT DOCUMENTS

| | | |
|---|---|---|
| 5,221,449 A | 6/1993 | Colgan et al. |
| 5,281,485 A | 1/1994 | Colgan et al. |
| 5,482,611 A | 1/1996 | Helmer et al. |
| 5,985,762 A | 11/1999 | Geffken et al. |
| 6,074,544 A | 6/2000 | Reid et al. |
| 6,080,285 A | 6/2000 | Liu et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,217,716 B1 | 4/2001 | Fai Lai |
| 6,221,757 B1 | 4/2001 | Schmidbauer et al. |
| 6,228,754 B1 | 5/2001 | Iacoponi et al. |
| 6,251,242 B1 | 6/2001 | Fu et al. |
| 6,274,008 B1 | 8/2001 | Gopalraja et al. |
| 6,277,249 B1 | 8/2001 | Gopalraja et al. |
| 6,287,977 B1 | 9/2001 | Hashim et al. |

OTHER PUBLICATIONS

Choi et al., "Method for Forming Damascene Interconnection of Semiconductor Device and Damascene Interconnection Fabricated Thereby." Pub, No. US 2002/00410278, Pub. Date: Apr. 11, 2002, 17 pages.

Rozbicki et al., "Method of Depositing Copper Seed on Semiconductor Substrates," Application No. 10/121,949, filed Apr. 10, 2002, 51 pages.

*Primary Examiner*—John F. Niebling
*Assistant Examiner*—Lynne A. Gurley
(74) *Attorney, Agent, or Firm*—Beyer Weaver & Thomas LLP (57) ABSTRACT

The present invention pertains to methods for forming a metal diffusion barrier on an integrated circuit wherein the formation includes at least two operations. The first operation deposits barrier material via PVD or CVD to provide some minimal coverage. The second operation deposits an additional barrier material and simultaneously etches a portion of the barrier material deposited in the first operation. The result of the operations is a metal diffusion barrier formed in part by net etching in certain areas, in particular the bottom of vias, and a net deposition in other areas, in particular the side walls of vias. Controlled etching is used to selectively remove barrier material from the bottom of vias, either completely or partially, thus reducing the resistance of subsequently formed metal interconnects.

73 Claims, 8 Drawing Sheets

METHOD OF DEPOSITING A DIFFUSION BARRIER FOR COPPER INTERCONNECT APPLICATIONS

CROSS-REFERENCE TO RELATED APPLICATIONS

This application claims priority under 35 USC 119(e) from U.S. Provisional Patent Application No. 60/275,803 naming Rozbicki et al. as inventors, titled "Method of Depositing Barrier-Seed Layer on Semiconductor Substrates," filed Mar. 13, 2001, which is incorporated herein by reference in its entirety for all purposes. This patent application is related to U.S. patent application Ser. No. 09/776,702, titled "Anti-Agglomeration of Copper in Integrated Circuit Metalization" filed by Rozbicki on Feb. 2, 2001, U.S. patent application Ser. No. 09/862,539, titled "Improved Deposition of Conformal Copper Seed Layers by Control of Barrier Layer Morphology" filed by Suwwan de Felipe on May 21, 2001, and U.S. patent application Ser. No. 09/965,471, titled "Method of Depositing a Diffusion Barrier for Copper Interconnection Applications" filed by Suwwan de Felipe on the same date as this application. These patent applications, along with all other patent applications, patents and publications mentioned herein are incorporated by reference in their entirety for all purposes.

FIELD OF THE INVENTION

The present invention pertains to methods for forming a metal diffusion barrier on an integrated circuit. More specifically, the methods include at least two operations. The first operation deposits barrier material via PVD or CVD to provide some coverage. The second operation deposits an additional barrier material and simultaneously etches a portion of the barrier material deposited in the first operation.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have been turning to copper because of its high conductivity and electromigration resistance, among other desirable properties. Most notable among the IC metalization processes that use copper is Damascene processing. Damascene processing is often a preferred method because it requires fewer processing steps than other methods and offers a higher yield. It is also particularly well-suited to metals such as Cu that cannot readily be patterned by plasma etching.

Damascene processing is a method for forming metal lines on integrated circuits. It involves formation of inlaid metal lines in trenches and vias formed in a dielectric layer (inter-metal dielectric). Damascene processing is often a preferred method because it requires fewer processing steps than other methods and offers a higher yield. It is also particularly well-suited to metals such as Cu that cannot readily be patterned by plasma etching. In order to frame the context of this invention, a brief description of a copper dual Damascene process for forming a partially fabricated integrated circuit is described below.

Figure 1A:
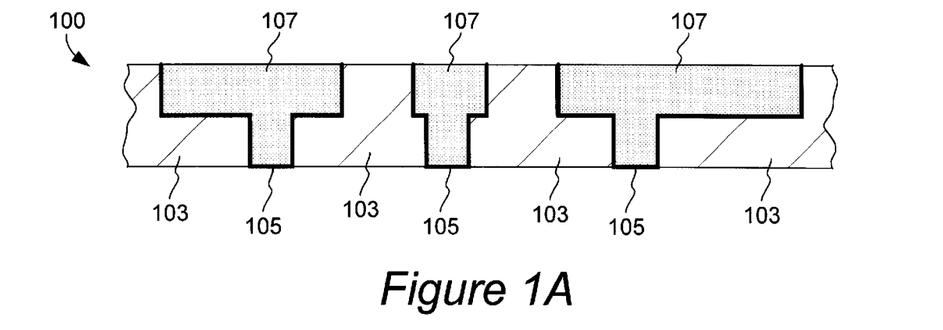
FIGS. 1A–G show cross sectional depictions of a copper dual Damascene fabrication process.

Presented in FIGS. 1A–1G, is a cross sectional depiction of a dual Damascene fabrication process. Referring to FIG. 1A, an example of a typical substrate, 100, used for dual damascene fabrication is illustrated. Substrate 100 includes a pre-formed dielectric layer 103 (such as silicon dioxide or organic-containing low-k materials) with etched line paths (trenches and vias) in which; a diffusion barrier 105 has been deposited followed by inlaying with copper conductive routes 107. Because copper or other mobile conductive material provides the conductive paths of the semiconductor wafer, the underlying silicon devices must be protected from metal ions (e.g., copper) that might otherwise diffuse into the silicon. Suitable materials for diffusion barrier 105 include tantalum, tantalum nitride, tungsten, titanium, titanium tungsten, titanium nitride, and the like. In a typical process, barrier 105 is formed by a physical vapor deposition (PVD) process such as sputtering or a chemical vapor deposition (CVD) process. Typical metals for the conductive routes are aluminum and copper. More frequently, copper serves as the metal in damascene processes, as depicted in these figures. The resultant partially fabricated integrated circuit 101 is a representative substrate for subsequent Damascene processing, as depicted in FIGS. 1B–1G.

Figure 1B:
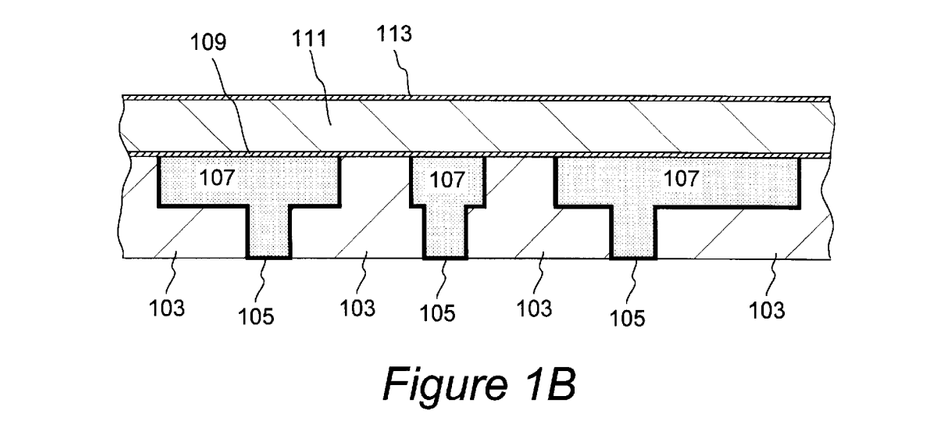

As depicted in FIG. 1B, a silicon nitride or silicon carbide diffusion barrier 109 is deposited to encapsulate conductive routes 107. Next, a first dielectric layer, 111, of a dual damascene dielectric structure is deposited on diffusion barrier 109. This is followed by deposition of an etch-stop layer 113 (typically composed of silicon nitride or silicon carbide) on the first dielectric layer 111.

Figure 1C:
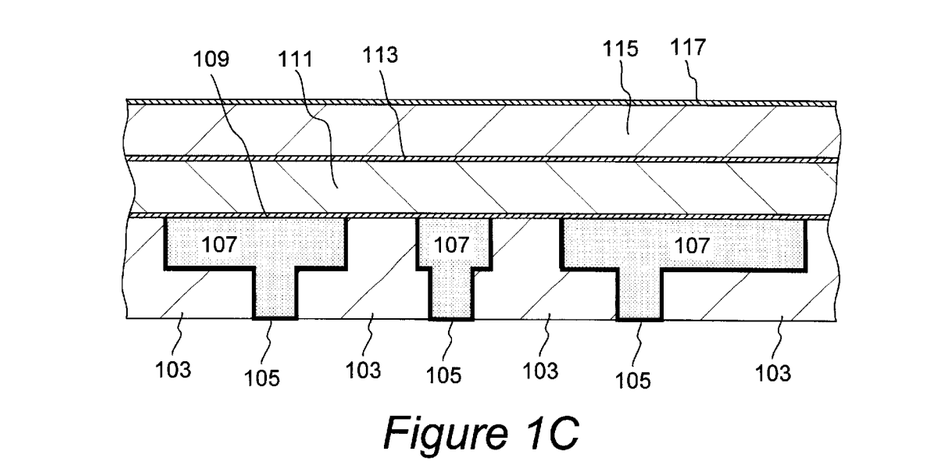

The process follows, as depicted in FIG. 1C, where a second dielectric layer 115 of the dual damascene dielectric structure is deposited in a similar manner to the first dielectric layer 111, onto etch-stop layer 113. Deposition of an antireflective layer 117, typically a silicon oxynitride, follows.

Figure 1D:
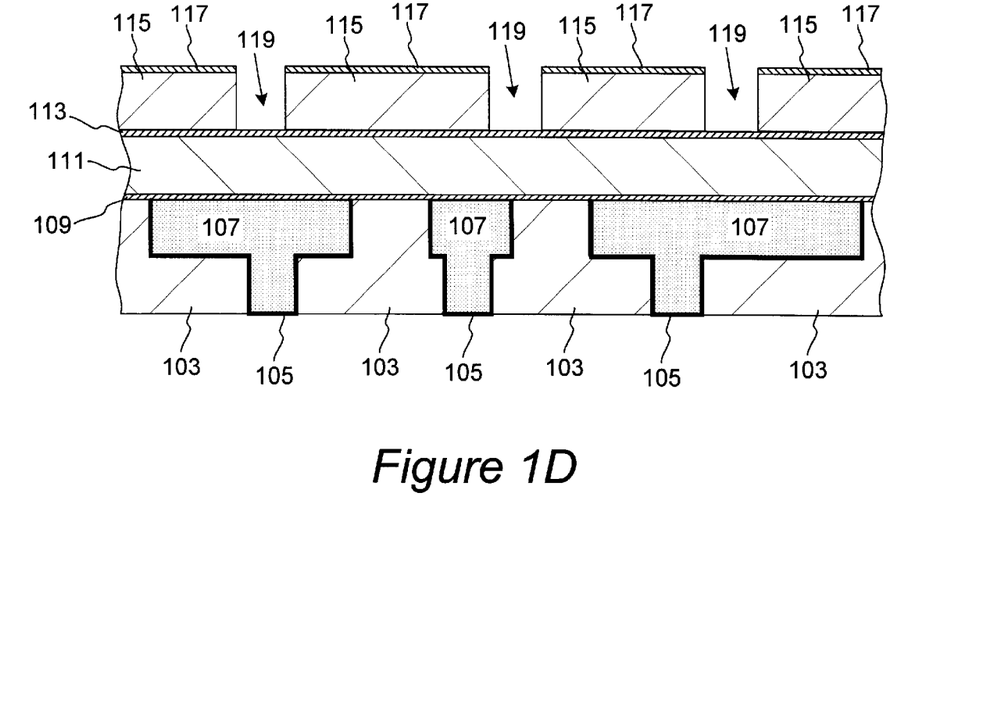
Figure 1E:
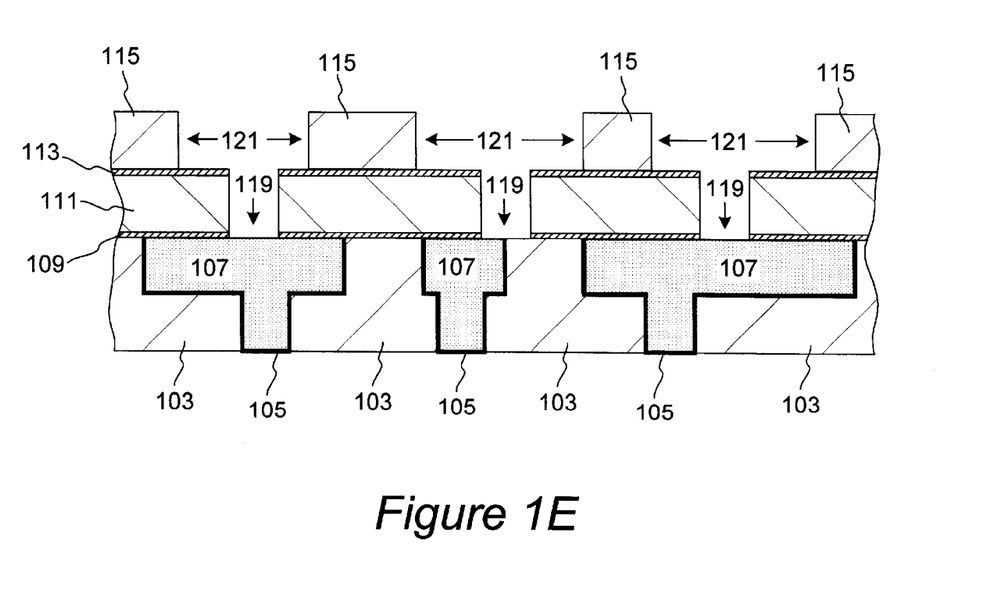

The dual Damascene process continues, as depicted in FIGS. 1D–1E, with etching of vias and trenches in the first and second dielectric layers. First, vias 119 are etched through antireflective layer 117 and the second dielectric layer 115. Standard lithography techniques are used to etch a pattern of these vias. The etching of vias 119 is controlled such that etch-stop layer 113 is not penetrated. As depicted in FIG. 1E, in a subsequent lithography process, antireflective layer 117 is removed and trenches 121 are etched in the second dielectric layer 115; vias 119 are propagated through etch-stop layer 113, first dielectric layer 111, and diffusion barrier 109.

Figure 1F:
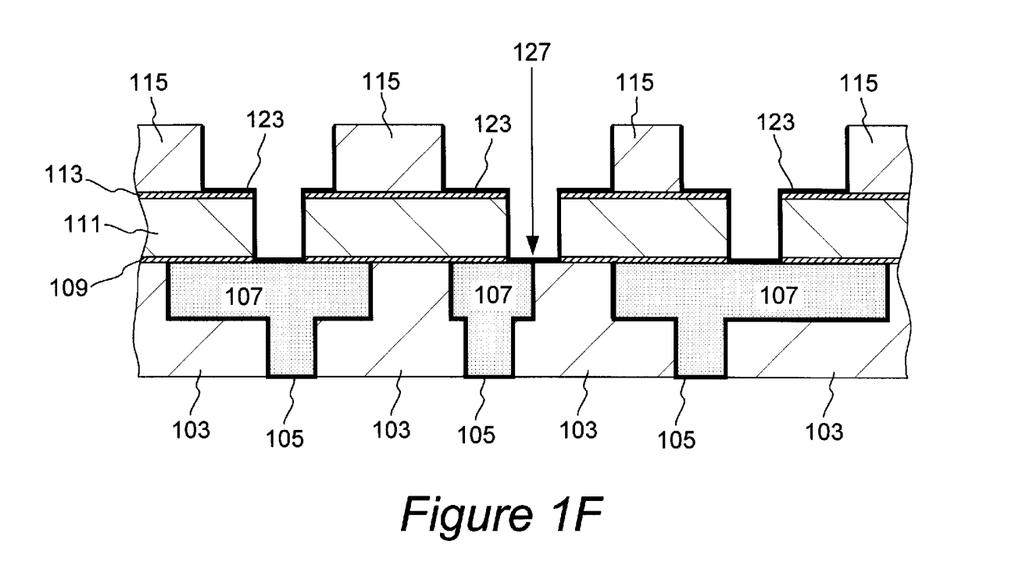

Next, as depicted in FIG. 1F, these newly formed vias and trenches are, as described above, coated with a conformal diffusion barrier 123. As mentioned above, barrier 123 is made of tantalum, titanium, or other materials that effectively block diffusion of copper atoms into the dielectric layers.

Figure 1G:
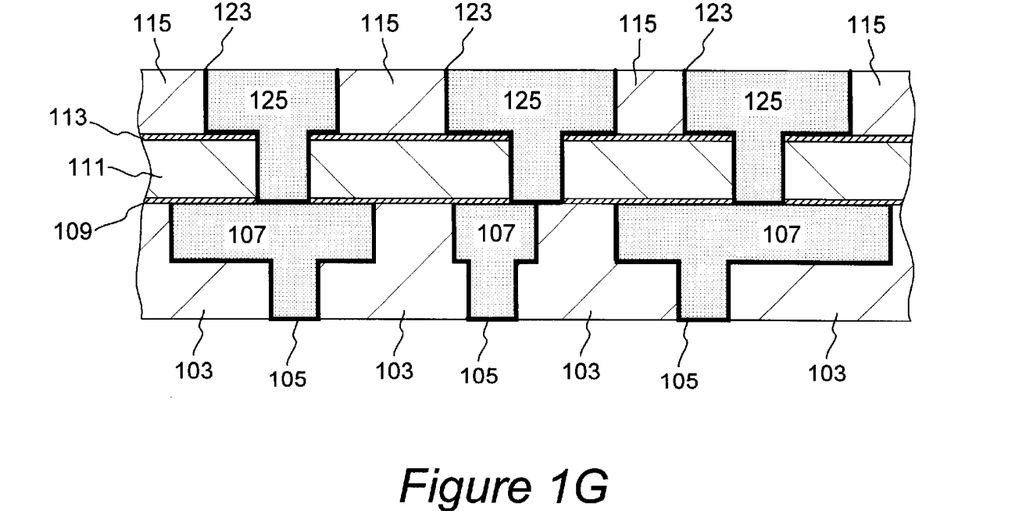

After diffusion barrier 123 is deposited, a seed layer of copper is applied (typically a PVD process) to enable subsequent electrofilling of the features with copper inlay. FIG. 1G shows the completed dual Damascene process, in which copper conductive routes 125 are inlayed (seed layer not depicted) into the via and trench surfaces over barrier 123.

Copper routes 125 and 107 are now in electrical contact and form conductive pathways, as they are separated by only by diffusion barrier 123 which is itself somewhat conductive. Although conformal barrier layers are sufficiently conductive for conventional circuitry, with the continuing need for faster (signal propagation speed) and more reliable microchip circuitry, the resistance of conformal barrier layers made of the materials mentioned above is problematic. The resistance of such barrier layers can be from ten to one hundred times that of copper. Thus, to reduce resistance between the copper routes, a portion of the diffusion barrier may be etched away, specifically at the via bottom, in order to expose the lower copper plug. In this way, the subsequent copper inlay can be deposited directly onto the lower copper plug. Conventional methods for etching away diffusion barriers at the bottom of vias (for example, the region of barrier 123 contacting copper inlay 107 in FIG. 1F) are problematic in that they are not selective enough. That is, conventional etch methods remove barrier material from undesired areas as well, such as the corners (edges) of the via, trench, and field regions. This can destroy critical dimensions of the via and trench surfaces (faceting of the corners) and unnecessarily exposes the dielectric to plasma.

In addition, conventional etching methods do not address unlanded contact regions. As illustrated in FIG. 1F, a portion of diffusion barrier 123 located at via bottom 127 does not fully contact copper inlay 107. In this case, a portion of the barrier rests on copper inlay 107 and a portion rests on dielectric 103. A conventional barrier etch, meant to expose copper inlay 107, would expose both copper inlay 107 and dielectric 103 in region 127. In that case, more process steps would be needed to repair or replace diffusion barrier on the newly-exposed region of dielectric 103, before any subsequent copper could be deposited thereon. Using conventional unselective "blanket" conformal deposition methods to re-protect the dielectric, one would create the same problem that existed before the etch, that is, higher resistance between copper routes due to the barrier itself.

What is therefore needed are improved methods of forming diffusion barriers on integrated circuit structures, selective methods in which the portion of the diffusion barrier at the bottom of vias is either completely or partially removed without sacrificing the integrity of the diffusion barrier in other regions. In this way, the resistance between inlayed metal conductive routes is reduced.

SUMMARY OF THE INVENTION

The present invention pertains to methods for forming a metal diffusion barrier on an integrated circuit in which the formation includes at least two operations. The first operation deposits barrier material via PVD or CVD to provide some minimal coverage. The second operation deposits an additional barrier material and simultaneously etches a portion of the barrier material deposited in the first operation. At least part of the first operation is performed in the same reaction chamber as the second operation. Some preferred methods of the invention are entirely done in a single process tool, without breaking vacuum. The result of the operations is a metal diffusion barrier formed in part by net etching in certain areas, in particular the bottom of vias, and a net deposition in other areas, in particular the side walls of vias. Controlled etching is used to selectively remove barrier material from the bottom of vias, either completely or partially, thus reducing the resistance of subsequently formed metal interconnects. In some aspects of the invention, selective etching is also used to remove contaminants under the barrier material, thus. obviating a separate preclean operation.

The invention accomplishes simultaneous etch and deposition by creation of unique plasma producing process conditions such that barrier material is etched away in some regions while in other regions barrier material is deposited. Thus, the descriptive term "etch to deposition ratio" or "E/D" is used from herein. More specifically, in the context of a partially fabricated integrated circuit having via and trench surface features, methods described herein provide that E/D varies as a function of the elevation profile of the surface features to which the plasma is applied. Generally, E/D is greatest at the bottom most regions of the wafer surface features and decreases in magnitude as elevation increases.

In this invention, there are three E/D scenarios created by control of process conditions. In the first scenario, E/D is greater than 1 at the via bottom, on the trench step, and on the field region. In the second scenario, E/D is greater than 1 at the via bottom and on the trench step, but less than one on the field region. In the third scenario, E/D is greater than 1 at the via bottom, but less than 1 on the trench step and on the field region. By using these three E/D scenarios, a variety of stack barrier layer structures are realized.

A preferred material for this etch/deposition sputter is tantalum, although the invention is not limited to tantalum. Other materials for which the invention is applicable include but are not limited to titanium, tungsten, cobalt, solid solutions (interstitial forms) of tantalum and nitrogen, and binary nitrides (e.g. $TaN_x$, TiN, $WN_x$). After diffusion barriers of the invention are formed, a metal conductive layer is deposited thereon. Where methods of the invention create a diffusion barrier having no barrier material at the bottom of the vias, the metal conductive layer makes direct contact with exposed metal conductive routes. Thus, one aspect of the invention is a method for depositing a diffusion barrier and a metal conductive layer for metal interconnects on a wafer substrate. Such methods may be characterized by the following sequence: (a) depositing a first portion of the diffusion barrier over the surface of the wafer substrate, (b) etching through the first portion of the diffusion barrier at the bottom of a plurality of vias while depositing a second portion of the diffusion barrier elsewhere on the wafer substrate, and (c) depositing the metal conductive layer over the surface of the wafer substrate such that the metal conductive layer contacts an underlying metal layer only at the bottom of the plurality of vias. Preferably at least part of (a) and all of (b) are performed in the same processing chamber. Additionally, the wafer may be precleaned before (a) in some preferred methods. In some preferred embodiments, all of (a)–(c) are performed in the same processing tool.

For unlanded vias (and in some instances for fully landed vias as well), methods of the invention create a diffusion barrier having minimal barrier material at the bottom of the vias. In this case, the resistance of the barrier between the metal conductive layer and underlying metal conductive routes is minimized. Thus, another aspect of the invention is a method for depositing a diffusion barrier and a metal conductive layer for metal interconnects on a wafer substrate. Such methods may be characterized by the following sequence: (a) precleaning the wafer substrate, (b) depositing a first portion of the diffusion barrier over the surface of the wafer substrate, (c) etching part-way through the first portion of the diffusion barrier at the bottom of a plurality of vias while depositing a second portion of the diffusion barrier elsewhere on the wafer substrate such that the diffusion barrier has a minimum thickness at the bottom of the plurality of vias, and (d) depositing the metal conductive layer over the surface of the wafer substrate. Preferably at least part of (b) and all of (c) are performed in the same processing chamber. In some preferred embodiments, all of (a)–(d) are performed in the same processing tool.

Preferably methods of the invention are used in Damascene processing in which the metal conductive layer and interconnects are made of copper. In some preferred methods of the invention, the metal conductive layer is a copper seed layer. Preferably seed layers of the invention are formed using PVD, but the invention is not limited in this way. As mentioned, in some methods of the invention, all aspects of a process flow for forming a diffusion barrier and depositing a metal conductive route thereon are done in the same processing tool.

Methods of the invention create diffusion barriers having stack structures. Distinct portions of each stack may be deposited (layered) using PVD, CVD, or other methods. Thus diffusion barriers of the invention may have bilayered or trilayered structures. Preferably, the portions include at least one of tantalum, nitrogen-doped tantalum, tantalum nitride, and titanium silicon nitride. More detail of preferred arrangements for the layering of these materials, methods of depositing, and structure of the diffusion barriers formed therefrom, will be described in the detailed description below.

Methods of the invention create diffusion barriers within integrated circuitry using at least the materials described above. Therefore, another aspect of the invention pertains to an integrated circuit or a partially fabricated integrated circuit. Preferably integrated circuits or partially fabricated integrated circuits of the invention include: a diffusion barrier which covers all surfaces of a plurality of vias and a plurality of trenches except that there is no diffusion barrier material at the bottom of the plurality of vias, and a metal conductive layer provided thereon, such that the metal conductive layer comes in direct contact with a plurality of metal conductive routes at the bottom of the plurality of vias. Particularly (but not necessarily) for unlanded vias, yet another aspect of the invention is an integrated circuit or a partially fabricated integrated circuit comprising: a diffusion barrier which covers all surfaces of a plurality of vias and a plurality of trenches, said diffusion barrier having a thickness of between about 50 and 400 Å on said surfaces except at the bottom of the plurality of vias where there is less than about 50 Å of diffusion barrier material; and a metal conductive layer provided thereon.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

In this application, the term wafer will be used interchangeably with partially fabricated integrated circuit. One skilled in the art would understand that the term "partially fabricated integrated circuit" can refer to a silicon wafer during any of many stages of integrated circuit fabrication thereon. Thus, "wafer", "wafer substrate", and "substrate" are all used interchangeably.

Figure 2A:
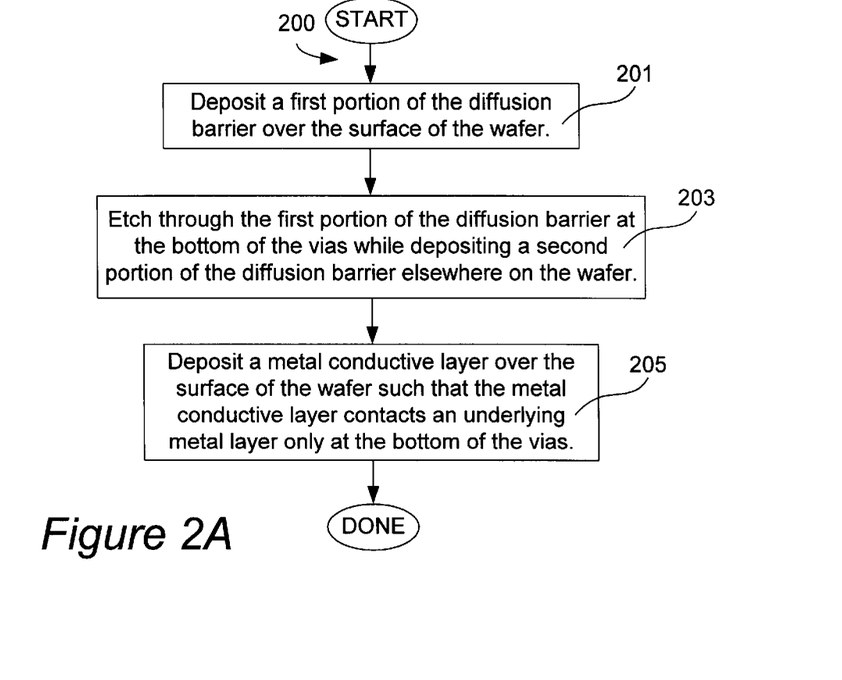
FIG. 2A presents aspects of a method for forming a diffusion barrier of the invention.
Figure 3A:
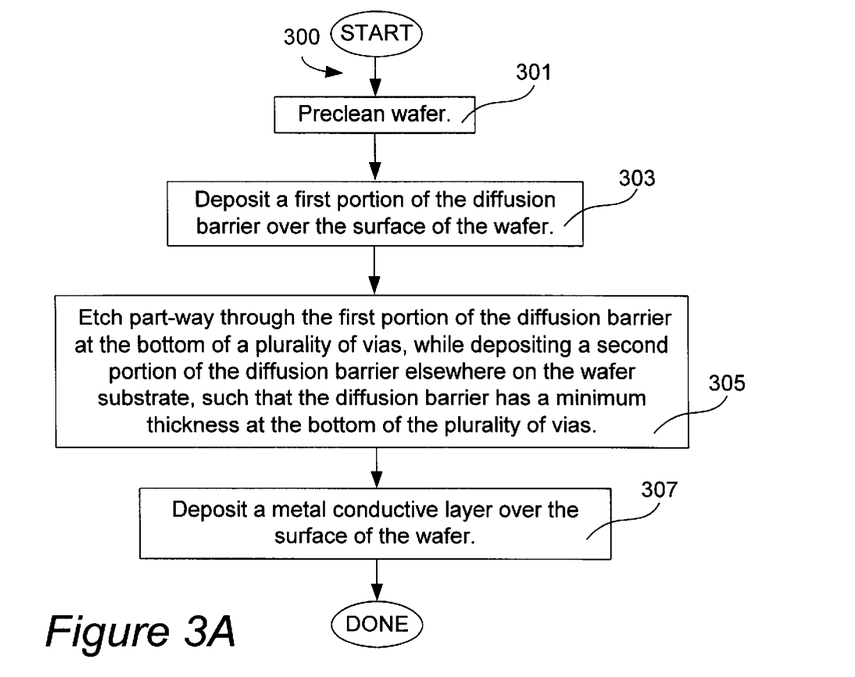
FIG. 3A presents aspects of a method for forming another diffusion barrier of the invention.

As mentioned, the invention finds particular use in Damascene processing. FIGS. 2A and 3A present aspects of process flows for forming diffusion barriers of the invention. Typically, the process flows are performed in the context of copper Damascene processing.

One can refer back to FIGS. 1A–1G for a slightly broader context. Specifically, referring to FIG. 1E, once vias and trenches have been formed in a wafer, typically a diffusion barrier will be formed thereon. For wafer substrates having vias that are entirely landed over underlying metal surfaces, methods of the invention which etch through barrier material at the bottom of vias are preferable. In some instances a wafer substrate may have unlanded vias (as described in the background section in reference to FIG. 1E). For wafer substrates having unlanded vias, methods of the invention that etch the barrier material at the bottom of the vias to a minimum are preferred.

Also as mentioned, the invention accomplishes simultaneous etch and deposition by creation of unique plasma producing process conditions such that barrier material is etched away in some regions while in other regions barrier material is deposited. More specifically, methods described herein provide that E/D varies as a function of the elevation profile of the surface features to which the plasma is applied. Generally, E/D is greatest at the bottom most regions of the wafer surface features and decreases in magnitude as elevation increases. In this invention, there are three E/D scenarios created by control of process conditions. In the first scenario, E/D is greater than 1 at the via bottom, on the trench step, and on the field region. In this first scenario, deposition of barrier material (occurring simultaneously with etch) occurs only on the side walls of the wafer surface features. In the second scenario, E/D is greater than 1 at the via bottom and on the trench step, but less than one on the field region. In this second scenario, deposition of barrier material (occurring simultaneously with etch) occurs not only on the side walls of the wafer surface features, but also on the field. In the third scenario, E/D is greater than 1 at the via bottom, but less than 1 on the trench step and on the field region. In this third scenario, deposition of barrier material (occurring simultaneously with etch at the via bottom) occurs not only on the side walls but also on the trench and field.

A method 200, of forming diffusion barriers of the invention will now be described with reference to the flow chart of FIG. 2A and associated schematic diagrams in FIGS. 2B–2E. Note that in many embodiments, each of the depicted process operations are carried out using process conditions and materials specific to a particular desired outcome. Specific examples will be discussed in detail below.

Referring to FIG. 2A, aspects of a process flow, 200, for forming a diffusion barrier of the invention are depicted. A first portion of the diffusion barrier is deposited over the surface of the wafer. See 201.

Figure 2B:
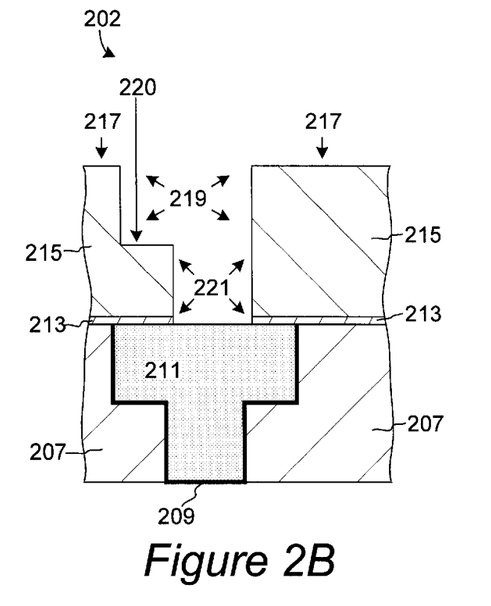
FIGS. 2B–E are cross-sectional depictions that illustrate various aspects of a process flow for forming a diffusion barrier of the invention as described in FIG. 2A.

Referring to FIG. 2B, a typical substrate, 202, is illustrated. Substrate 202 includes a pre-formed dielectric layer 207 (such as silicon dioxide or organic-containing low-k materials) with etched line paths (trenches and vias) in which; a diffusion barrier 209 has been deposited followed by inlaying with copper conductive route 211. A silicon nitride or silicon carbide barrier layer 213 was laid thereon, followed by another layer of dielectric material, 215. After process steps (including lithography) for example as outlined in the background section above, dielectric layer 215 has etched trench 219 and via 221. Note that included in this surface feature are horizontal surfaces (field 217, step 220 of trench 219, and bottom of via 221) and vertical surfaces (the side walls of the via and trench). At the bottom of via 221, copper conductive route 211 is exposed. In some embodiments it is desired to preclean contaminants from these features before deposition of barrier material, this can be done in the same processing chamber or not. In other embodiments, the simultaneous etch/deposition (as described below) is used to remove surface contaminants from the via bottom by etching through a barrier material thereon. In this way, the barrier is removed only at the via bottom and the exposed copper is effectively cleaned (etched) by exposure to the plasma. Contaminants include residues left from etch and photoresist clean processes and oxides of copper in some instances.

Again referring to 201 in FIG. 2A, deposition of the first portion of the diffusion barrier may be done using PVD or CVD. Preferably, the first portion of the diffusion barrier includes at least one of tantalum, nitrogen-doped tantalum, tantalum nitride, and titanium silicon nitride. Tantalum, nitrogen-doped tantalum, and tantalum nitride are preferably deposited using PVD. As mentioned, other materials for which the invention is applicable include but are not limited to titanium, tungsten, cobalt, solid solutions (interstitial forms) of tantalum and nitrogen, and binary nitrides (e.g. $TaN_x$, TiN, $WN_x$). These materials would also preferably be deposited by PVD. Titanium silicon nitride is preferably deposited using CVD. The first portion of the diffusion barrier is preferably a conformal (contour following, continuous, and of relatively uniform thickness) monolayer. In this description, the term "monolayer" is meant to mean a single layer of material, not necessarily a single atomic or molecular layer as the term is sometimes used. In some embodiments, a bilayer is preferred for the first portion of the diffusion barrier.

Figure 2C:
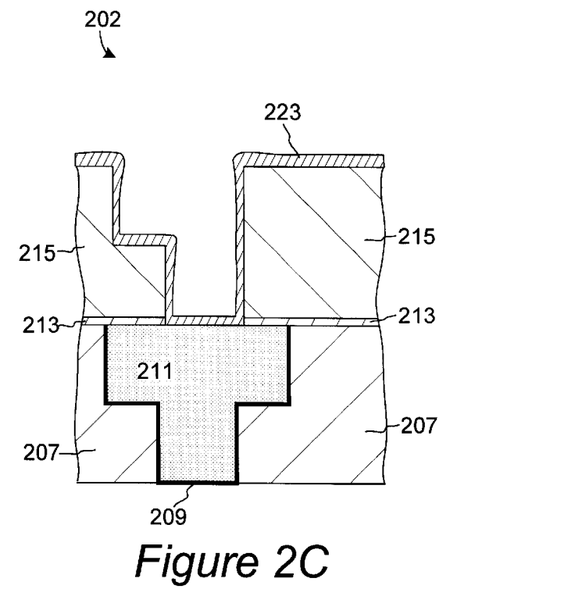

FIG. 2C depicts substrate 202, after deposition of the first portion of the diffusion barrier. In this example the first portion is a conformal monolayer 223 that covers all surfaces of substrate 202. Preferably, the monolayer is between about 50 and 300 Å thick on the field of the wafer, more preferably about 100 Å thick.

Figure 2D:
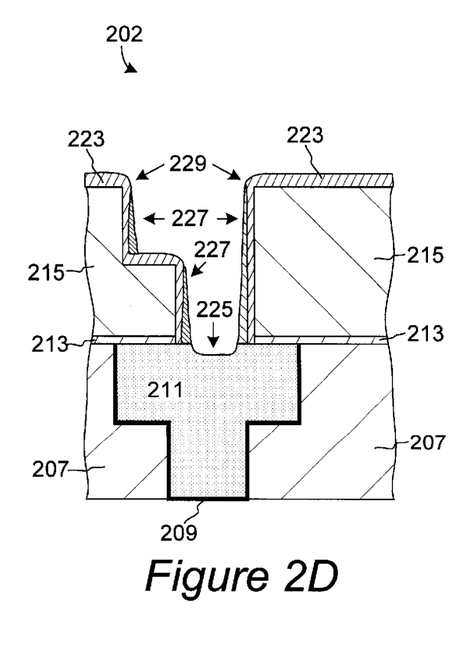

Referring to FIG. 2A, once the first portion of the diffusion barrier is deposited, simultaneous etch/deposition is used to etch through the first portion of the diffusion barrier at the bottom of the vias while depositing a second portion of the diffusion barrier elsewhere on the wafer. See 203. Preferably the second portion of the diffusion barrier is a sputtered metal. Even more preferably, the sputtered metal is tantalum. FIG. 2D depicts substrate 202 after such an etch/deposition process in which the etch to deposition ratio was greater than 1, both in the bottom of via 221 and on the horizontal surfaces (field 217 and step 220 (see FIG. 2B)). The relative rate of etch was controlled such that step 220 and field 217 were minimally etched relative to the bottom of via 221. Thus, the first portion 223 is etched through at the bottom of via 221, exposing the surface of copper conductive route 211. See 225. Concurrent with the etch, barrier material 227 (the second portion) is deposited on the side walls of the via and trench. Preferably, the second portion will have between about 25 and 100 Å of barrier material. Additionally, there is minimal faceting of the corners (unlike conventional etching methods). See 229.

Thus, the resulting structure 202 has a diffusion barrier (bilayer) that includes first portion 223 and second portion 227. The diffusion barrier is discontinuous, in that it does not cover copper conductive route 211. Note that even though plasma etch was used and copper route 211 was exposed, the dielectric layers were not exposed to plasma during the method. This is a distinct advantage over conventional diffusion barrier formation methods which involve a plasma etch.

Note also that in some instances it has been experimentally determined that there may be a finite amount of the barrier material (e.g. tantalum) implanted into the copper conductive route surface at the bottom of the via. In this invention, this scenario is still considered to mean "exposed copper" at the via bottom, since the tantalum is implanted into the copper and subsequent copper seed layer or inlay makes direct contact with this "doped" copper surface.

Figure 2E:
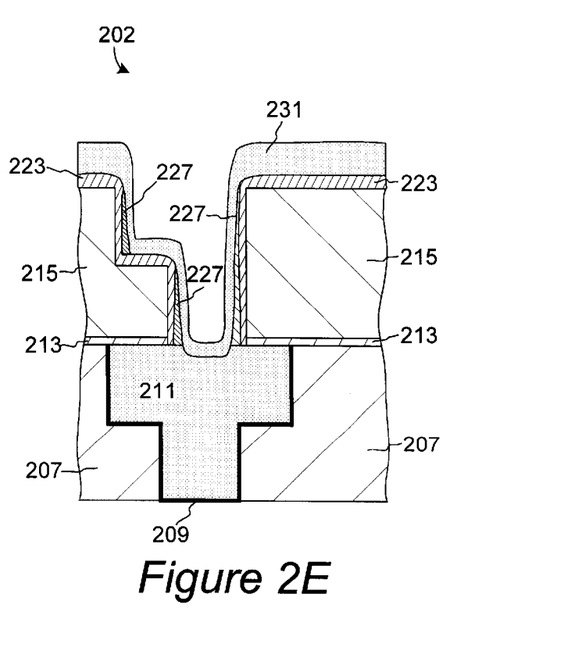

Referring again to FIG. 2A, once the diffusion barrier is formed, a metal conductive layer 231 is deposited over the surface of the wafer such that the metal conductive layer contacts the underlying metal layer only at the bottom of the vias. See 205. FIG. 2E depicts substrate 202 after deposition of metal conductive layer 231. In this example, the metal conductive layer is a copper seed layer, but the invention is not limited to seed layers. For example, the metal conductive layer can comprise an electroless metal fill. Once the metal conductive layer is deposited, the method 200 is done.

As illustrated in FIG. 2E, newly deposited metal conductive layer 231 now is in direct contact with underlying copper inlay 211. Substrate 202 is now ready for bulk electrochemical or electroless fill for formation of conductive routes that will fill completely its surface features.

Figure 2F:
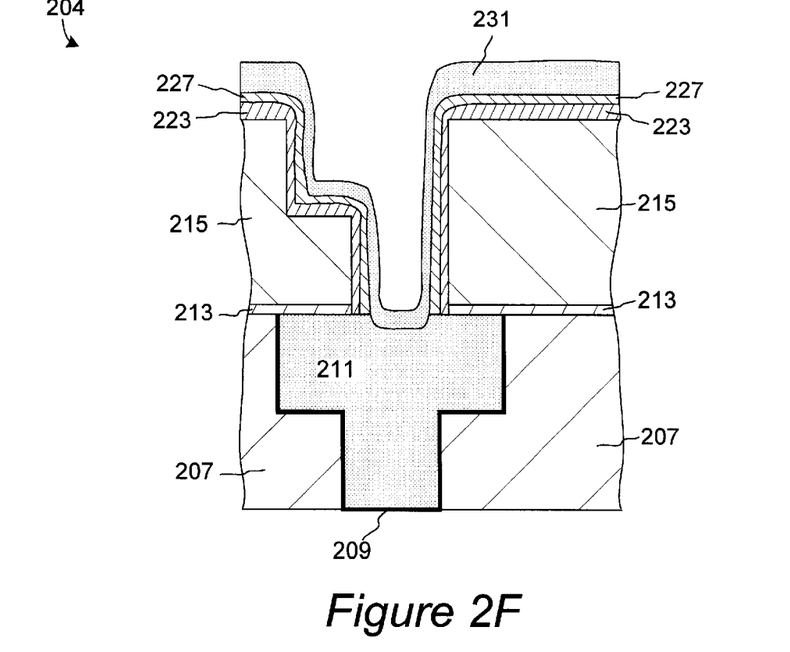
FIG. 2F is a cross-sectional depiction of a portion of a partially fabricated integrated circuit of the invention that is made using a process flow similar to that described for FIGS. 2B–E.

In the above description, and as illustrated in FIGS. 2D–E, the second portion (227) of the barrier layer is deposited only on the side walls of the surface features of substrate 202. Some methods of the invention use etch to deposition ratios greater than one at the via bottom, but less than one on the field and trench regions. In this case, the second portion of barrier material will be deposited on the field and trench as well as the side walls. Preferably, the second portion will have between about 50 and 500 Å of barrier material deposited on the field and horizontal trench surfaces. FIG. 2F, depicts the resulting structure 204 obtained (after seed layer deposition). Structure 204 is similar to structure 202 (depicted in FIG. 2E), except that a diffusion barrier is formed in which second portion 227 now covers all of the remaining first portion 223 (that which was not etched through). Thus, E/D in the trench and on the field was less than one, while at the bottom of the via, E/D was greater than one. Copper conductive route 211 was still exposed at the bottom of the via (due to E/D>1) and thus seed layer 231 is in direct contact with 211, analogous to structure 202 (FIG. 2E).

Figure 2G:
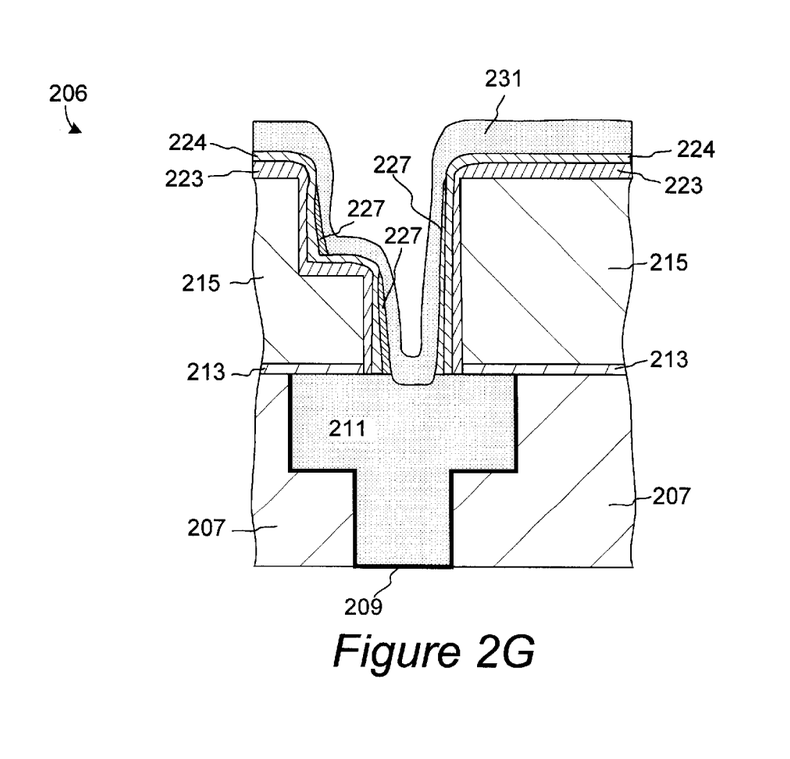
FIG. 2G is a cross-sectional depiction of a portion of another partially fabricated integrated circuit of the invention that is made using a process flow similar to that described for FIGS. 2B–E.

In another preferred method of the invention, the first portion of the diffusion barrier will be a bilayer, and once the second portion is deposited a trilayer will result. If the first portion of the diffusion barrier is a bilayer, the bilayer will be made of a first deposited layer and a second deposited layer thereon. Either of the first or second deposited layers of the bilayer may include at least one of tantalum, nitrogen-doped tantalum, tantalum nitride, and titanium silicon nitride. These materials are preferably deposited as mentioned above. FIG. 2G depicts an example substrate 206, having such a trilayer diffusion barrier. In this case, a conformal layer 223 is deposited over the surface of the wafer, then another conformal layer 224 is deposited thereon (co-continuous, covering the entire surface). Once the bilayer (first portion) is deposited, then the second portion of the diffusion barrier is deposited using the simultaneous etch/deposition method. In this example, the second portion, 227, is deposited only on the side walls and layers 223 and 224 are etched though at the bottom of the via. The resulting barrier layer is the trilayer structure depicted in FIG. 2G (shown with copper seed layer 231 deposited on the diffusion barrier). Alternatively, second portion 227 can be deposited on the trench and field horizontal surfaces as well as the side walls.

Diffusion barrier stack structures (bilayers, trilayers, etc.) can provide better protection against metal diffusion than single layers due to the combined properties of the individual layers of which they are made. In some cases, multi-layered diffusion barriers can also be made thicker to serve as a fill element. For example, in some low-k dielectric applications, lithography leaves the dielectric with undercuts (notches) or bowing (concavity) in the side walls. These defects can be repaired by deposition of extra barrier material which fills the defects. Judicious combinations of CVD and PVD methods are used to achieve this end. One problem with this approach is the resistance at the via bottom due to multiple layers of barrier material. The instant invention solves this problem. For example, depending on the need, in accordance with FIG. 2G, layer 223 or layer 224 may be deposited using either CVD or PVD. Methods of the invention enhance defect repair methodology by providing methods that either remove or minimize unwanted barrier material at the bottom of the vias.

In order to describe formation of diffusion barriers intended primarily (but not necessarily) for unlanded vias, a method 300, of forming diffusion barriers of the invention will now be described with reference to the flow chart of FIG. 3A and associated schematic diagrams in FIGS. 3B–3E. Again, note that in many embodiments, each of the depicted process operations are carried out using process conditions and materials specific to a particular desired outcome. The invention is not limited to these specific embodiments, but rather they are intended to illustrate the invention.

Referring to FIG. 3A, aspects of a process flow, 300, for forming a diffusion barrier of the invention are depicted. The wafer is precleaned. See 301. Precleaning is performed in the case of unlanded vias, because subsequently deposited barrier material will not be fully etched through at the bottom of the via. Thus any contaminants that reside on the via prior to deposition of barrier material would remain there if not removed in a preclean operation. Next, a first portion of the diffusion barrier is deposited over the surface of the wafer. See 303.

Figure 3B:
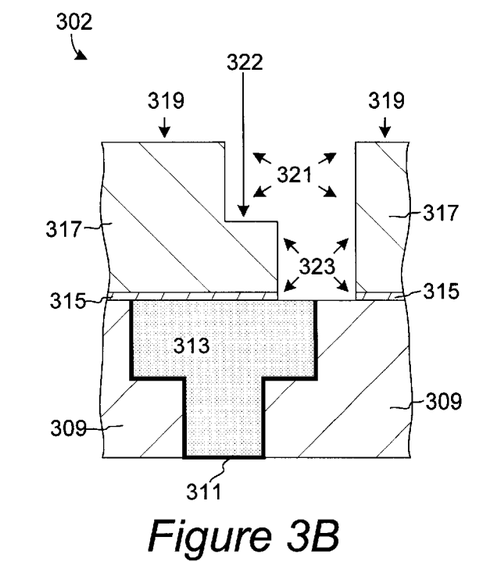
FIGS. 3B–E are cross-sectional depictions that illustrate various aspects of a process flow for forming another diffusion barrier of the invention as described in FIG. 3A.

Referring to FIG. 3B, a typical substrate, 302, is illustrated. Substrate 302 includes a pre-formed dielectric layer 309 (such as silicon dioxide or organic-containing low-k materials) with etched line paths (trenches and vias) in which; a diffusion barrier 311 has been deposited followed by inlaying with copper conductive route 313. A silicon nitride or silicon carbide barrier layer 315 was laid thereon, followed by another layer of dielectric material, 317. After process steps (including lithography) for example as outlined in the background section above, dielectric layer 317 has etched trench 321 and via 323. Note that included in this surface feature are horizontal surfaces (field 319, step 322 of trench 321, and the bottom of via 323) and vertical surfaces (the side walls of the via and trench). The surface area at the bottom of via 323, includes a portion of exposed copper conductive route 313 and a portion of exposed dielectric 309. As mentioned, it is desired to preclean (preferably in the same processing tool) contaminants from these surfaces prior to deposition of barrier material. Contaminants include residues left from etch and photoresist clean processes and oxides of copper in some instances.

Figure 3C:
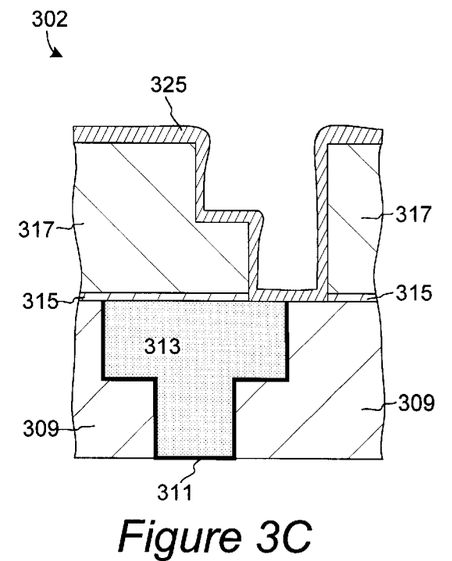

Again referring to 303 in FIG. 3A, deposition of the first portion of the diffusion barrier may be done using PVD or CVD. Preferably, the first portion of the diffusion barrier includes at least one of tantalum, nitrogen-doped tantalum, tantalum nitride, and titanium silicon nitride. Tantalum, nitrogen-doped tantalum, and tantalum nitride are preferable deposited using PVD. Titanium silicon nitride is preferably deposited using CVD. The first portion of the diffusion barrier is preferably a conformal monolayer. In some embodiments, a bilayer is preferred for the first portion of the diffusion barrier. FIG. 3C depicts substrate 302, after deposition of the first portion of the diffusion barrier. In this example the first portion is a conformal monolayer 325 that covers all surfaces of substrate 302. Preferably, the monolayer is between about 50 and 300 Å thick on the field of the wafer, more preferably about 100 Å thick.

Referring to FIG. 3A, once the first portion of the diffusion barrier is deposited, simultaneous etch/deposition is used to etch part way through the first portion of the diffusion barrier at the bottom of the vias while depositing a second portion of the diffusion barrier elsewhere on the wafer. Preferably, this process creates a diffusion barrier having a minimum thickness at the bottom of the via. See 305. Preferably, the minimum thickness will be between about 30 and 100 Å while the diffusion barrier on the side walls and horizontal surfaces is between about 50 and 400 Å thick.

Figure 3D:
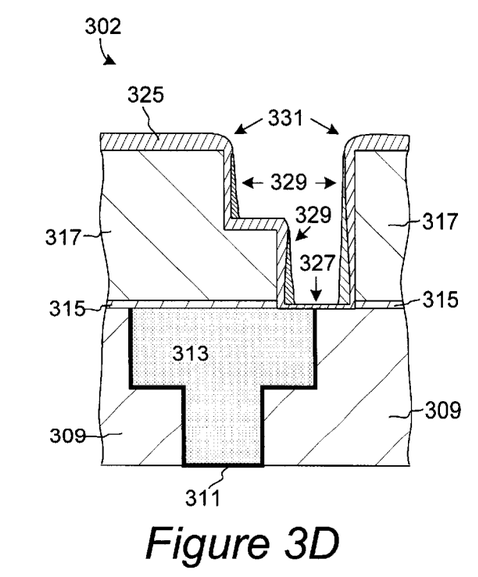

FIG. 3D depicts substrate 302 after such an etch/deposition process in which the etch to deposition ratio was greater than 1, both in the bottom of via 323 and on the horizontal surfaces (field 319 and step 322 (see FIG. 3B)). The relative rate of etch was controlled such that step 322 and field 319 were minimally etched relative to the bottom of via 323. Thus, the first portion 325 is etched to a minimum thickness at the bottom of via 323. See 327. Barrier material 329 (the second portion) is however deposited on the side walls of the via and trench. Preferably, the second portion will have between about 25 and 100 Å of barrier material. Additionally, there is minimal faceting of the corners (unlike conventional etching methods). See 331. Thus, the resulting structure 302 has a diffusion barrier (bilayer) that includes continuous first portion 325 and discontinuous second portion 329.

Figure 3E:
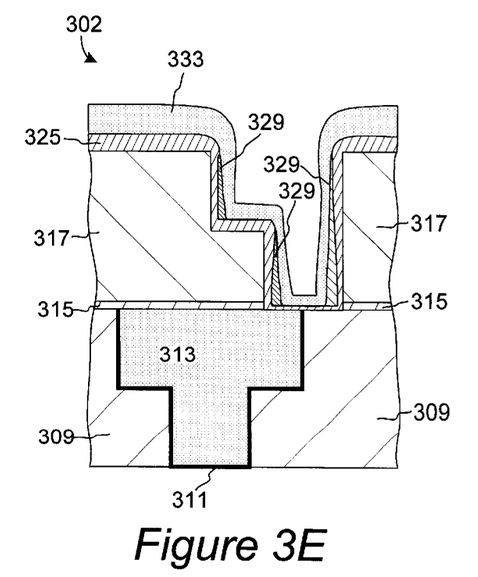

Referring again to FIG. 3A, once the diffusion barrier is formed, a metal conductive layer 333 is deposited over the surface of the wafer such that the metal conductive layer contacts the underlying metal layer only at the bottom of the vias. See 307. FIG. 3E depicts substrate 302 after deposition of metal conductive layer 333. In this example, the metal conductive layer is a copper seed layer, but the invention is not limited to seed layers. Once the metal conductive layer is deposited, the method 300 is done.

As illustrated in FIG. 3E, newly deposited metal conductive layer 333 is separated from underlying copper inlay 313 by a region of the diffusion barrier having minimal thickness. Preferably between about 25 and 300 Å are removed to provide this minimal thickness. Substrate 302 is now ready for bulk electrofill (or electroless metal deposition) for formation of conductive routes which will fill completely its surface features.

In the above description, and as illustrated in FIGS. 3D–E, the second portion of the barrier layer is deposited only on the side walls of the surface features of substrate 302. As mentioned, some methods of the invention use etch to deposition ratios greater than one at the via bottom, but less than one on the field and trench regions. In this case, the second portion of barrier material will be deposited on the field and trench as well as the side walls. Preferably, the second portion has between about 50 and 500 Å of barrier material deposited on the field and horizontal trench surfaces.

Figure 3F:
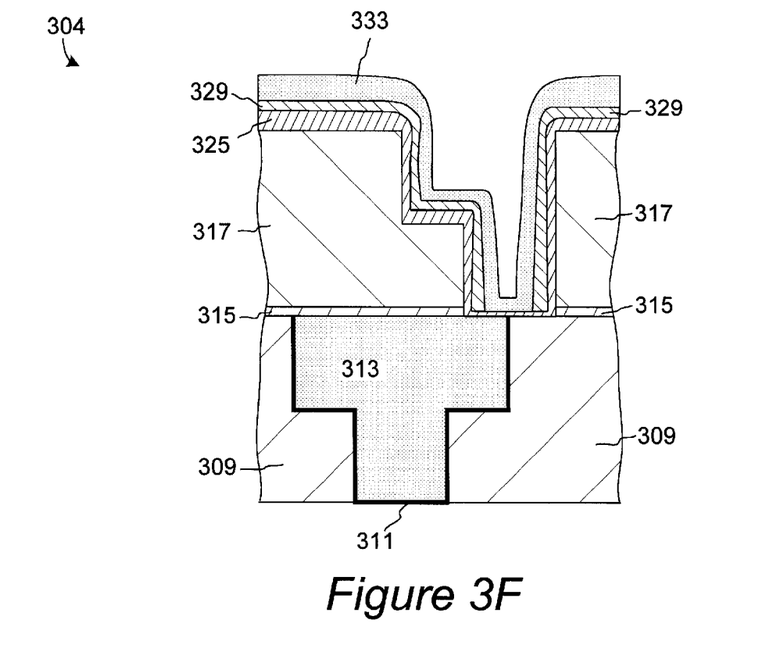
FIG. 3F is a cross-sectional depiction of a portion of a partially fabricated integrated circuit of the invention that is made using a process flow similar to that described for FIGS. 3B–E.

FIG. 3F, depicts the resulting structure 304 obtained (after seed layer deposition) using such an E/D scenario. Structure 304 is similar to structure 302 (depicted in FIG. 3E), except that a diffusion barrier is formed in which first portion 325 is continuous over the surface of the wafer and second portion 329 covers all of first portion 325 except at the bottom of the via. As second portion 329 was deposited, first portion 325 was partially etched at the via bottom. Thus, E/D in the trench and on the field was less than one, while at the bottom of the via, E/D was greater than one.

In another preferred method of the invention, the first portion of the diffusion barrier will be a bilayer, and once the second portion is deposited a trilayer will result. As in the methods for fully landed vias, if the first portion of the diffusion barrier is a bilayer, the bilayer will have a first deposited layer and a second deposited layer thereon. Either of the first or second deposited layers of the bilayer may include at least one of tantalum, nitrogen-doped tantalum, tantalum nitride, and titanium silicon nitride. These materials.are preferably deposited as mentioned above.

Figure 3G:
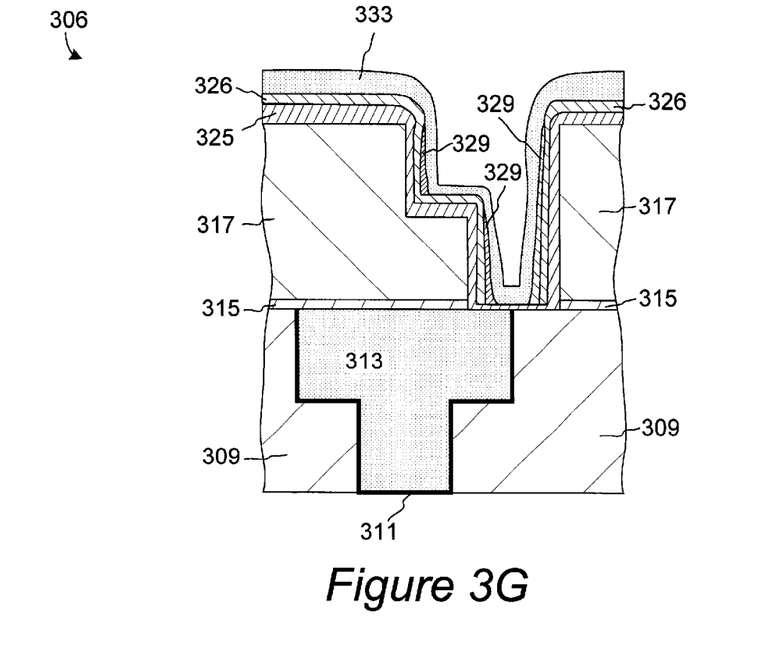
FIG. 3G is a cross-sectional depiction of a portion of another partially fabricated integrated circuit of the invention that is made using a process flow similar to that described for FIGS. 3B–E.

FIG. 3G depicts an example substrate 306, having such a trilayer diffusion barrier. In this case, a conformal layer 325 is deposited over the surface of the wafer, then another conformal layer 326 is deposited thereon. Once the bilayer (first portion) is deposited, then the second portion of the diffusion barrier is deposited using the simultaneous etch/deposition method. In this example, the second portion, 329, is deposited only on the side walls. At the same time, layer 326 is preferably etched through and layer 325 is etched only part way through at the bottom of the via. The resulting barrier layer is the trilayer structure depicted in FIG. 3G.

Alternatively, only layer 326 is etched wholly or partially, leaving layer 325 intact, resulting in a diffusion barrier having a minimum thickness at the bottom of the via. Also, alternatively, second portion 329 can be deposited on the trench and field horizontal surfaces as well as on the side walls.

EXPERIMENTAL

As mentioned, methods of the invention employ a simultaneous etch/deposition to etch barrier material at the via bottom while depositing barrier material elsewhere on a wafer substrate. As well, various aspects of process flows involve deposition of barrier materials (either by CVD or PVD), precleaning, and degassing operations. In certain preferred embodiments all these process steps are done in the same processing tool. One tool that allows degas, preclean, CVD deposition, and PVD deposition all under the same vacuum is the INOVA Tool available from Novellus Systems of San Jose, California. Therefore, once a wafer is in the tool and a vacuum is established, at least in some embodiments, all of the above described process aspects are performed without breaking vacuum. Only sources are changed during the operation, e.g. changing from a CVD source to a PVD source. For example, a wafer is placed into the apparatus, it is degassed, precleaned (for example with an argon plasma), a first deposited layer of barrier material is applied via CVD (e.g. titanium silicon nitride), a second deposited layer is applied via PVD (e.g. tantalum nitride). The first and second deposited layers make the first portion of the diffusion barrier. Finally, a tantalum etch/deposition process is carried out which deposits the second portion of the diffusion barrier and etches at least the bottom of the via, forming the final diffusion barrier structure.

Preferably the simultaneous etch/deposition is carried out using hollow-cathode magnetron (HCM) sputtering. Such devices are described in U.S. Pat. No. 5,482,611, naming Helmer et al. as inventors, U.S. Pat. Nos. 6,179,973 B1 and 6,193,854 B1, naming Lai et al. as inventors, and U.S. Pat. No. 6,217,716 B1 naming Fai Lai as the inventor. If the barrier material to be deposited is tantalum, a tantalum target source is used.

Preferable process conditions for include a pressure of between about 0.1 and 100 mTorr. Argon flows are between about 50 and 300 SCCM (standard cubic centimeters per minute). When E/D>1 is desired both at the bottom of the vias and in the field, a DC source power of between about 1 and 10 kW (low power embodiments) is applied to the tantalum target. When an E/D>1 is desired at the bottom of the vias, but E/D<1 in the field is desired, a DC source power of between about 10 and 30 kW (high power embodiments) is applied to the tantalum target. The m-coil (electromagnetic coil for controlling field shape and thus plasma flux) current used is between about 0.1–2.0 A, preferably about 1 A. The wafer temperature is manipulated using a temperature controlled stage, the wafer temperatures used are between about −100 and 100° C., preferably about −50° C. The wafer is biased with an RF frequency source (located below or in proximity to the stage). For methods where it is intended to etch through vias, the RF frequency is preferably between about 100 kHz and 50 MHz. For methods where it is intended to etch only part way through vias, the RF frequency is preferably between about 100 kHz and 50 MHz. The RF power applied is preferably between about 100 and 500 W. In preferred embodiments, the amount of sputtering is controlled by the RF power at fixed RF frequency. Various RF frequencies can be used to achieve this effect. One preferred RF frequency is 13.56 MHz.

In general, etch rate is most strongly related to the RF power, while the deposition rate is most strongly related to the DC source power. The E/D ratio depends predominantly on the ratio of RF power (table) to DC power (source). The higher the RF/DC power ratio, the higher the E/D ratio on the wafer. The etch rate is largely dependent on RF power and pressure since these parameters control the energy of Ar ions near the wafer. The deposition rate is largely dependent on DC power since this parameter affects the flux and energy of Ar ions near the surface target.

While not wishing to be bound by theory, it is believed that the RF frequency creates anisotropic plasma conditions. The etch/deposition ratio (E/D) can be controlled so that it is >1 in the via bottom and (resulting in a net etching), and >1 or <1 on the trench and field horizontal surfaces. The magnitude of E/D on the side walls is <1 because the plasma flux is directed primarily toward the wafer surface (parallel with the side walls). Thus, only horizontal surfaces (with relatively large surface areas (compared to the side walls)) are effectively etched by the impinging plasma flux. The side walls receive a net deposition.

If tantalum nitride or nitrogen-doped tantalum is the barrier material to be deposited, a nitrogen source such as $N_2$ will be used at 10–100 SCCM, preferably about 30 SCCM in conjunction with argon. Titanium silicon nitride is deposited by CVD using a technique described in U.S. patent application Ser. No. 09/965,471, entitled "Method of Depositing a Diffusion Barrier for Copper Interconnection Applications" filed by Suwwan de Felipe on the same date as this application, or U.S. patent application Ser. No. 09/862,539, titled "Improved Deposition of Conformal Copper Seed Layers by Control of Barrier Layer Morphology" filed by Suwwan de Felipe on May 21, 2001.

As mentioned, methods of the invention form diffusion barriers having stacked structures. Both methods primarily intended for fully landed vias (etch through at via bottom) and methods primarily intended for unlanded vias (partial etch at via bottom) form bilayered and trilayered diffusion barriers. Illustrative structures of diffusion barriers of the invention were described above with reference to the figures. The table below summarizes further aspects of some preferred embodiments of the invention. Each of the twelve listed diffusion barriers may vary according to the particular thickness of the deposited layers, and whether or not material is deposited only on the side walls or on the side walls and the field and horizontal trench regions during the simultaneous etch deposition (E/D) process step. Therefore this table is meant to emphasize some preferred stack compositions as well as particular methods used to form them. The symbol "Ta(N)" is meant to designate tantalum with some nitrogen content. This can be nitrogen-doped tantalum, solid solutions (interstitial forms) of tantalum and nitrogen, or tantalum nitrides. Titanium silicon nitride is designated by "TiN(Si)."

TABLE

Preferred Diffusion Barriers of the Invention.

| Diffusion Barrier | Pre-clean | Barrier Material 1 | Barrier Material 2 | Barrier Material 3 |
|---|---|---|---|---|
| 1 | no | HCM Ta(N) | Ta E/D etch through | — |
| 2 | no | CVD TiN(Si) | Ta E/D etch through | — |
| 3 | yes | HCM Ta(N) | Ta E/D etch partial | — |
| 4 | yes | HCM Ta(N) | Ta E/D etch through | — |
| 5 | no | HCM Ta(N) | CVD TiN(Si) | Ta E/D etch through |
| 6 | yes | HCM Ta(N) | CVD TiN(Si) | Ta E/D etch partial |
| 7 | yes | HCM Ta(N) | CVD TiN(Si) | Ta E/D etch through |
| 8 | no | CVD TiN(Si) | HCM Ta(N) | Ta E/D etch through |
| 9 | yes | CVD TiN(Si) | HCM Ta(N) | Ta E/D etch partial |
| 10 | yes | CVD TiN(Si) | HCM Ta(N) | Ta E/D etch through |
| 11 | yes | CVD TiN(Si) | Ta E/D etch through | — |
| 12 | yes | CVD TiN(Si) | Ta E/D etch partial | — |

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for depositing a diffusion barrier and a metal conductive layer for metal interconnects on a wafer substrate, the method comprising:
   (a) depositing a first portion of the diffusion barrier over the surface of the wafer substrate;
   (b) etching the first portion of the diffusion barrier at the bottom of a plurality of vias without fully etching through such that an amount of barrier material remains at the bottom of the plurality of vias, while depositing a second portion of the diffusion barrier elsewhere on the wafer substrate; and
   (c) depositing the metal conductive layer over the surface of the wafer substrate such that the metal conductive layer contacts the barrier material remaining at the bottom of the plurality of vias;
   wherein at least part of (a) and all of (b) are performed in the same processing chamber.

2. The method of claim 1, wherein the metal conductive layer comprises copper.

3. The method of claim 1, wherein the metal conductive layer is a seed layer.

4. The method of claim 1, wherein the first portion of the diffusion barrier is a monolayer and the second portion of the diffusion barrier comprises a sputtered metal.

5. The method of claim 4, wherein the sputtered metal is tantalum.

6. The method of claim 5, wherein the monolayer comprises at least one of tantalum, nitrogen-doped tantalum, and tantalum nitride.

7. The method of claim 5, wherein the monolayer comprises titanium silicon nitride.

8. The method of claim 6, further comprising precleaning the wafer substrate prior to (a).

9. The method of claim 7, further comprising precleaning the wafer substrate prior to (a).

10. The method of claim 1, wherein the first portion of the diffusion barrier is a bilayer having a first deposited layer and a second deposited layer thereon, and the second portion of the diffusion barrier comprises a sputtered metal.

11. The method of claim 10, wherein the sputtered metal is tantalum.

12. The method of claim 11, wherein the first deposited layer comprises at least one of tantalum, nitrogen-doped tantalum, and tantalum nitride, and the second deposited layer comprises titanium silicon nitride.

13. The method of claim 11, wherein the first deposited layer comprises titanium silicon nitride, and the second deposited layer comprises at least one of tantalum, nitrogen-doped tantalum, and tantalum nitride.

14. The method of claim 12, further comprising precleaning the wafer substrate prior to (a).

15. The method of claim 13, further comprising precleaning the wafer substrate prior to (a).

16. The method of claim 1, wherein depositing a second portion of the diffusion barrier elsewhere on the wafer substrate comprises depositing between about 25 and 100 Å of the second portion of the diffusion barrier at least on the side walls of the plurality of vias.

17. The method of claim 16, wherein depositing a second portion of the diffusion barrier elsewhere on the wafer substrate further comprises depositing between about 50 and 500 Å of the second portion of the diffusion barrier on the field and a plurality of horizontal trench surfaces of the wafer substrate.

18. The method of claim 1, further comprising precleaning the wafer substrate prior to (a).

19. The method of claim 6, wherein the monolayer is between about 50 and 300 Å thick on the field of the wafer substrate.

20. The method of claim 6, wherein the monolayer is about 100 Å thick on the field of the wafer substrate.

21. The method of claim 8, wherein the monolayer is between about 50 and 300 Å thick on the field of the wafer substrate.

22. The method of claim 8, wherein the monolayer is about 100 Å hick on the field of the wafer substrate.

23. The method of claim 12, wherein the first deposited layer is between about 50 and 300 Å thick on the field of the wafer substrate.

24. The method of claim 12, wherein the first deposited layer is about 100 Å thick on the field of the wafer substrate.

25. The method of claim 14, wherein the first deposited layer is between about 50 and 300 Å thick on the field of the wafer substrate.

26. The method of claim 14, wherein the first deposited layer is about 100 Å thick on the field of the wafer substrate.

27. The method of claim 1, wherein (b) comprises a PVD etch/deposition process in which an RF frequency is applied to the wafer substrate such that the etch to deposition ratio is greater than 1 in the bottom of the plurality of vias and less than 1 on the field.

28. The method of claim 1, wherein (b) comprises a PVD etch/deposition process in which an RF frequency is applied to the wafer substrate such that the etch rate at the bottom of the plurality of vias is greater than the etch rate on any associated horizontal trench surfaces or the field.

29. The method of claim 27, wherein the RF frequency is between about 100 kHz and 50 MHz.

30. The method of claim 28, wherein the RF frequency is between about 100 kHz and 50 MHz.

31. The method of claim 29, further comprising using a source power of between about 10 and 30 kW.

32. The method of claim 30, further comprising using a source power of between about 1 and 10 kW.

33. The method of claim 31, further comprising using an RF power of between about 100 and 500 W.

34. The method of claim 32, further comprising using an RF power of between about 100 and 500 W.

35. The method of claim 33, further comprising using an Ar flow of between about 10 and 300 SCCM.

36. The method of claim 34, further comprising using an Ar flow of between about 10 and 300 SCCM.

37. The method of claim 35, further comprising using a pressure of between about 0.1 and 100 mTorr.

38. The method of claim 36, further comprising using a pressure of between about 0.1 and 100 mTorr.

39. The method of claim 1, wherein the method comprises a component of a Damascene process.

40. The method of claim 1, wherein (a)–(c) are performed in the same processing tool.

41. The method of claim 8, wherein (a)–(c) and precleaning the wafer substrate are performed in the same processing tool.

42. The method of claim 14, wherein (a)–(c) and precleaning the wafer substrate are performed in the same processing tool.

43. The method of claim 15, wherein (a)–(c) and precleaning the wafer substrate are performed in the same processing tool.

44. The method of claim 18, wherein (a)–(c) and precleaning the wafer substrate are performed in the same processing tool.

45. The method of claim 1, wherein at least one of the plurality of vias is an unlanded via.

46. A method for depositing a diffusion barrier and a metal conductive layer for metal interconnects on a wafer substrate, the method comprising:

(a) precleaning the wafer substrate;

(b) depositing a first portion of the diffusion barrier over the surface of the wafer substrate;

(c) etching part-way through the first portion of the diffusion barrier at the bottom of a plurality of vias while depositing a second portion of the diffusion barrier elsewhere on the wafer substrate such that the diffusion barrier has a minimum thickness at the bottom of the plurality of vias; and (d) depositing the metal conductive layer over the surface of the wafer substrate, including the minimum thickness of diffusion barrier at the bottom of the plurality of vias;

wherein at least part of (b) and all of (c) are performed in the same processing chamber.

47. The method of claim 46, wherein the metal conductive layer comprises copper.

48. The method of claim 46, wherein the metal conductive layer is a seed layer.

49. The method of claim 46, wherein the first portion of the diffusion barrier is a monolayer and the second portion of the diffusion barrier comprises a sputtered metal.

50. The method of claim 49, wherein the sputtered metal is tantalum.

51. The method of claim 50, wherein the monolayer comprises at least one of tantalum, nitrogen-doped tantalum, tantalum nitride, and titanium silicon nitride.

52. The method of claim 46, wherein the first portion of the diffusion barrier is a bilayer having a first deposited layer and a second deposited layer thereon, and the second portion of the diffusion barrier comprises a sputtered metal.

53. The method of claim 52, wherein the sputtered metal is tantalum.

54. The method of claim 52, wherein the first deposited layer comprises at least one of tantalum, nitrogen-doped tantalum, and tantalum nitride, and the second deposited layer comprises titanium silicon nitride.

55. The method of claim 52, wherein the first deposited layer comprises titanium silicon and the second deposited layer comprises at least one of tantalum, nitrogen-doped tantalum, and tantalum nitride.

56. The method of claim 46, wherein etching part-way through the first portion of the diffusion barrier at the bottom of a plurality of vias comprises removing between about 25 and 300 Å of the first portion of the diffusion barrier.

57. The method of claim 46, wherein depositing a second portion of the diffusion barrier elsewhere on the wafer substrate comprises depositing between about 25 and 100 Å of the second portion of the diffusion barrier at least on the side walls of the plurality of vias.

58. The method of claim 57, wherein depositing a second portion of the diffusion barrier elsewhere on the wafer substrate further comprises depositing between about 50 and 500 Å of the second portion of the diffusion barrier on the field and a plurality of horizontal trench surfaces of the wafer substrate.

59. The method of claim 51, wherein the monolayer is between about 50 and 300 Å thick on the field of the wafer substrate.

60. The method of claim 54, wherein the monolayer is about 100 Å thick on the field of the wafer substrate.

61. The method of claim 54, wherein the first deposited layer is between about 50 and 300 Å thick on the field of the wafer substrate.

62. The method of claim 54, wherein the first deposited layer is about 100 Å thick on the field of the wafer substrate.

63. The method of claim 46, wherein (b) comprises a PVD etch/deposition process in which an Rf frequency is applied to the wafer substrate such that the etch to deposition ratio is greater than 1 in the bottom of the plurality of vias and less than 1 on the field.

64. The method of claim 63, wherein the RF frequency is between about 100 kHz and 50 MHz.

65. The method of claim 63, wherein the RF frequency is about 13.56 MHz.

66. The method of claim 63, further comprising using a source power of between about 10 and 30 kW.

67. The method of claim 66, further comprising using an RF power of between about 100 and 500 W.

68. The method of claim 67, further comprising using an Ar flow of between about 10 and 300 SCCM.

69. The method of claim 68, further comprising using a pressure of between about 0.1 and 100 mTorr.

70. The method of claim 46, wherein the method comprises a component of a Damascene process.

71. The method of claim 46, wherein (a)–(d) are performed in the same processing tool.

72. The method of claim 46, wherein the minimum thickness is between about 30 and 100 Å.

73. The method of claim 72, wherein the diffusion barrier is between about 50 and 400 Å thick on the side walls, the horizontal trench regions, and the field.

* * * * *